United States Patent [19]
Nagahara et al.

[11] Patent Number: 5,864,062
[45] Date of Patent: Jan. 26, 1999

[54] SEMICONDUCTOR ACCELERATION SENSOR

[75] Inventors: Teruaki Nagahara; Hiroshi Otani, both of Tokyo, Japan

[73] Assignee: Mitsubishi Denki Kabushiki Kaisha, Tokyo, Japan

[21] Appl. No.: 864,074

[22] Filed: May 28, 1997

[30] Foreign Application Priority Data

Nov. 18, 1996 [JP] Japan ................................ 8-306276

[51] Int. Cl.$^6$ .................................................... G07P 15/00
[52] U.S. Cl. ............................... 73/514.01; 73/514.32; 257/417
[58] Field of Search ................. 73/777, 780, 514.32, 73/514.01, 514.16, 514.35, 514.36; 257/665, 666, 787, 417; 361/813

[56] References Cited

U.S. PATENT DOCUMENTS

| | | | |
|---|---|---|---|
| 4,556,587 | 12/1985 | Tsiamis et al. | 427/304 |
| 4,582,729 | 4/1986 | Tsiamis et al. | 427/304 |
| 5,417,312 | 5/1995 | Tsuchitani et al. | 188/181 A |
| 5,545,912 | 8/1996 | Ristic et al. | 257/417 |
| 5,606,128 | 2/1997 | Araki | 73/514.16 |
| 5,684,428 | 11/1997 | Nomura et al. | 327/509 |

FOREIGN PATENT DOCUMENTS

| | | |
|---|---|---|
| 34268 | 1/1991 | Japan . |
| A-4047271 | 2/1992 | Japan . |
| A-4204339 | 7/1992 | Japan . |
| A-5157762 | 6/1993 | Japan . |
| A-6290993 | 10/1994 | Japan . |

Primary Examiner—Hezron Williams
Assistant Examiner—Richard A. Moller

[57] ABSTRACT

A semiconductor acceleration sensor comprises a semiconductor sensor chip for detecting acceleration and an IC chip for processing the signal from this sensor chip, the IC chip is bonded to the sensor chip, the sensor chip is mounted to a die pad, electrical connection is established by lead wires connected to lead terminals, and a package is formed by molding with resin wherein the die pad is electrically connected to a particular lead terminal by a lead wire and is grounded by the particular lead terminal, and the die pad is positioned remote from the mounting surface of the package.

7 Claims, 7 Drawing Sheets

SEMICONDUCTOR ACCELERATION SENSOR

BACKGROUND OF THE INVENTION

1. Field of the Invention

The present invention relates to a semiconductor acceleration sensor for automotive applications, and relates particularly to a semiconductor acceleration sensor used with air bags.

2. Description of the Prior Art

There has been known a semiconductor acceleration sensor for detecting vibration and acceleration wherein a semiconductor substrate having a thin-film diaphragm at a middle portion thereof is cantilevered at one end thereof. On the thin-film diaphragm, plural piezoresistance elements are formed to detect a force exerted thereto based on changes in the resistances of the piezoresistance elements.

FIG. 11 is a cross section of a conventional semiconductor acceleration sensor using a hermetically sealed package.

Referring to FIG. 11, semiconductor acceleration sensor 100 is a hermetically sealed package comprising a cap 101 and stem 102 with plural conductive leads 103. The cap 101 is a box-shaped member of which the side with the greatest area is open. The open edge of this cap 101 is welded to the flat panel-like stem 102 such that the stem 102 closes the box-shaped container.

A thick-film substrate 104 is bonded to the stem 102. A pedestal 106 is bonded to the thick-film substrate 104, and a sensor chip 105 is bonded to the pedestal 106 in a cantilevered manner. The thick-film substrate 104 and sensor chip 105 are connected by bonding wires or other lead wires 107. By thus using a metal package, the semiconductor acceleration sensor is shielded from operating errors induced by electromagnetic interference from such sources as engine noise, radios, and portable telephones. It is, however, difficult to reduce the size and cost of the semiconductor acceleration sensor when a metal package is used.

As a result, capacitance-type semiconductor acceleration sensors that electrically detect acceleration from the change in the capacity of the capacitor have been used as semiconductor acceleration sensors because of the ability to thereby reduce the package size and cost.

FIG. 12 is a partial cross section of a conventional capacitance-type semiconductor acceleration sensor, and FIG. 13 is a cross section along line IV—IV in FIG. 12.

As shown in FIG. 12 and FIG. 13, this capacitance-type semiconductor acceleration sensor 110 comprises a sensor chip 111 for sensing acceleration and converting acceleration to a change in electrostatic capacity; an IC chip 112 for converting the change in electrostatic capacity output by the sensor chip 111 to an electrical signal, and applying a particular signal processing operation to the resulting electrical signal; a die pad 113 to which the sensor chip 111 is die bonded; lead terminals 114 for electrical connection to the circuit board; bonding wires or other lead wires 115 for connecting the sensor chip 111 and IC chip 112, and the IC chip 112 to the external lead terminals 114; and a molded resin package 116.

Inside the sensor chip 111 are a fixed electrode and a moving electrode that is displaced by the force of inertia at acceleration. The dielectric constant between the fixed electrode and moving electrode is constant at a constant gap therebetween. As a result, the capacitance of the capacitor formed by the dielectric between the fixed electrode and moving electrode changes when the electrode distance between the fixed electrode and moving electrode changes due to displacement of the moving electrode at acceleration. It is therefore possible to detect acceleration by detecting this change in electrostatic capacity using the IC chip 112. However, the change in electrostatic capacity is extremely small, specifically on the order of 1 pF or less, and is therefore susceptible to the effects of external noise.

SUMMARY OF THE INVENTION

Therefore, an object of the present invention is to provide a semiconductor acceleration sensor using a molded resin package enabling size and cost reductions that is also resistant to the effects of external noise, including electromagnetic waves.

To achieve the above object, a semiconductor acceleration sensor according to a preferred embodiment of the invention has a semiconductor sensor chip for detecting acceleration and an IC chip for processing the signal from this sensor chip wherein said IC chip is bonded to said sensor chip, said sensor chip is mounted to a die pad, electrical connection is established by means of lead wires connected to lead terminals, and a package is formed by molding with resin. The die pad is electrically connected to a particular lead terminal by a lead wire and is grounded by means of said lead terminal, and the lead terminals are formed so that during mounting the die pad is positioned in a direction facing the mounting surface of the package.

It is further preferable in the above semiconductor acceleration sensor for the sensor chip to detect acceleration and convert the detected acceleration to a change in electrostatic capacity, and for the IC chip to convert the change in electrostatic capacity output from the sensor chip to an electrical signal and apply specific processing thereto.

In this latter case it is further advantageous if the sensor chip is formed by bonding a pair of opposing protective substrates with a sensor unit disposed therebetween where said sensor unit is formed on a silicon substrate for detecting acceleration from the electrostatic capacity between a fixed electrode and a moving electrode that is displaced by the force of inertia at acceleration. Said sensor unit further comprises an external frame that defines the contour of the sensor unit and is formed to be insulated from the moving electrode and fixed electrode while enclosing the moving electrode and fixed electrode. Said external frame is further electrically connected to a particular lead terminal by a lead wire, and is grounded by said lead terminal.

A semiconductor acceleration sensor according to an alternative embodiment of the invention has a semiconductor sensor chip for detecting acceleration and an IC chip for processing the signal from this sensor chip wherein said IC chip is bonded to said sensor chip, said sensor chip is mounted to a die pad, electrical connection is established by means of lead wires connected to lead terminals, and a package is formed by molding with resin. The sensor chip is coated substantially completely with a conductive metal vapor deposition coating, said conductive metal is electrically connected to a particular lead terminal by lead wire, and the sensor chip is grounded by said lead terminal. The lead terminals are formed so that during mounting the die pad is positioned in a direction facing the mounting surface of the package.

It is further advantageous in the preceding alternative embodiment of a semiconductor acceleration sensor according to the invention for the sensor chip to be formed by bonding a pair of opposing protective substrates with a sensor unit disposed therebetween where the sensor unit is formed on a silicon substrate for detecting acceleration from the electrostatic capacity between a fixed electrode and a moving electrode that is displaced by the force of inertia from acceleration, and has an external frame that defines the contour of the sensor unit and is formed to be insulated from the moving electrode and fixed electrode while enclosing the moving electrode and fixed electrode.

It is further advantageous when the semiconductor acceleration sensor is mounted to the circuit board so that the sensor chip and IC chip are positioned over the ground wiring pattern formed on the circuit board.

In each of the embodiments described above it is also preferable for the lead terminal to be further connected to a bypass capacitor.

BRIEF DESCRIPTION OF THE DRAWINGS

The present invention will become more fully understood from the detailed description given below and the accompanying drawings wherein.

DESCRIPTION OF PREFERRED EMBODIMENTS

The preferred embodiments of the present invention are described below with reference to the accompanying figures.
Embodiment 1

Figure 1:
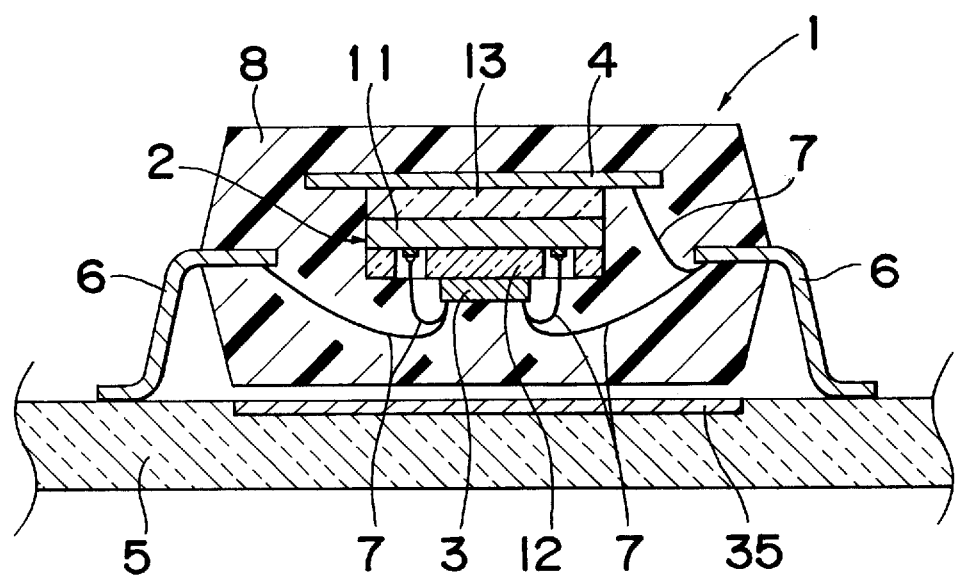
FIG. 1 is a cross sectional diagram of a capacitance-type semiconductor acceleration sensor according to the first embodiment of the invention.

FIG. 1 is a cross sectional diagram of a capacitance-type semiconductor acceleration sensor 1 according to the first embodiment of the invention.

Referring to FIG. 1, this capacitance-type semiconductor acceleration sensor 1 comprises a sensor chip 2 for sensing acceleration and converting acceleration to a change in electrostatic capacity; an IC chip 3 for converting the change in electrostatic capacity output by the sensor chip 2 to an electrical signal, and applying a particular signal processing operation to the resulting electrical signal; a die pad 4 to which the sensor chip 2 is die bonded; lead terminals 6 for electrical connection to the circuit board 5; bonding wires or other lead wires 7 for connecting the sensor chip 2 and IC chip 3, the IC chip 3 and lead terminals 6, and the die pad 4 and lead terminals 6; and a molded resin package 8.

Note that the die pad 4 and lead terminals 6 form a lead frame until they are separated during the manufacturing process of the capacitance-type semiconductor acceleration sensor 1.

Figure 2:
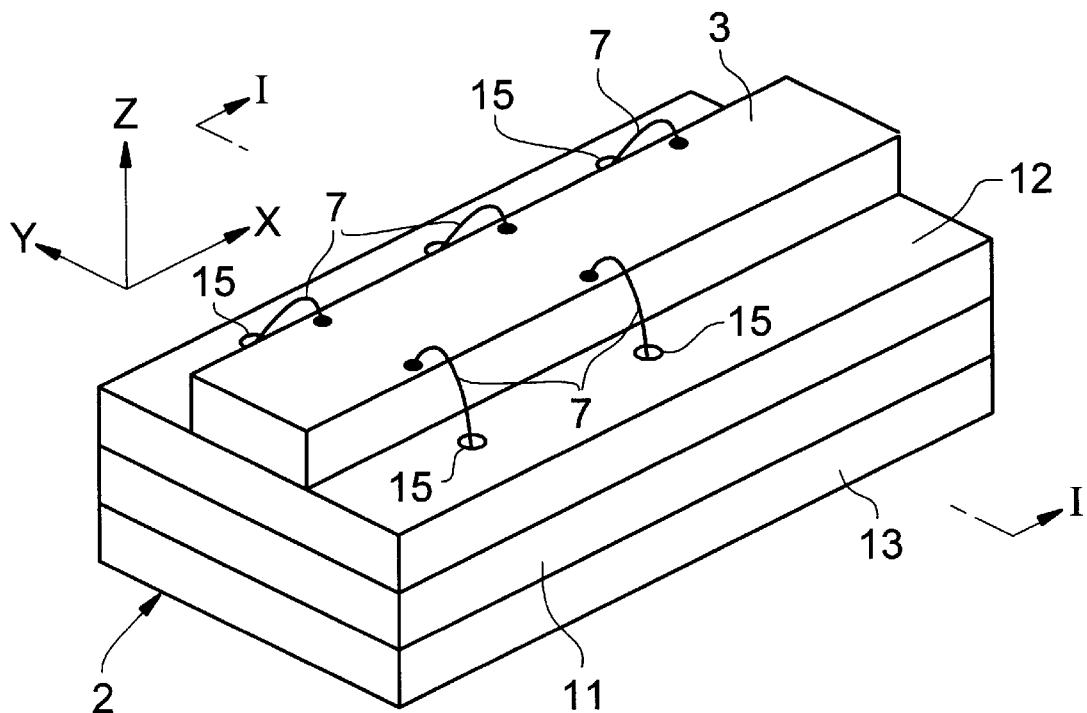
FIG. 2 is an overview of the sensor chip 2 and IC chip 3 shown in FIG. 1.

FIG. 2 is an overview of the sensor chip 2 and IC chip 3 shown in FIG. 1. Referring to FIG. 2, the sensor chip 2 comprises a sensor unit 11 disposed between and bonded to a pair of protective substrates 12 and 13. The sensor unit 11 is made from a silicon substrate and converts the inertial force of acceleration to a change in electrostatic capacity. The protective substrates 12 and 13 are made from a material such as aluminosilicate or borosilicate glass having a linear expansion coefficient close to that of silicon. The IC chip 3 converts the change in electrostatic capacity output from the sensor unit 11 to an electrical signal, and applies particular signal processing to the electrical signal.

Plural electrode holes 15, i.e., through-holes, for connecting particular electrodes on sensor unit 11 to IC chip 3 by means of lead wires 7, are formed in protective substrate 12. The IC chip 3 is bonded to protective substrate 12 with an adhesive or other bonding means.

Figure 3:
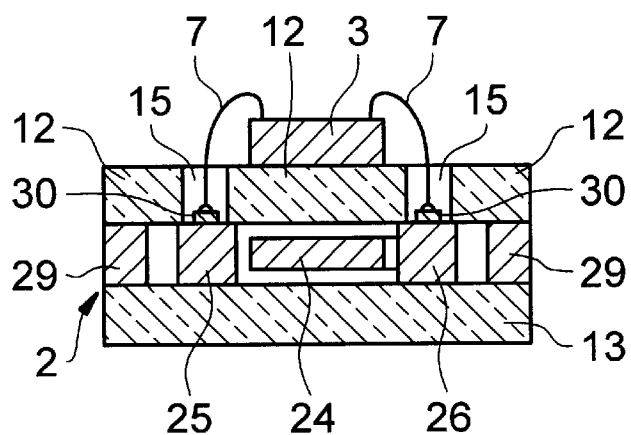
FIG. 3 is a cross sectional view along line I—I in FIG. 2.
Figure 4:
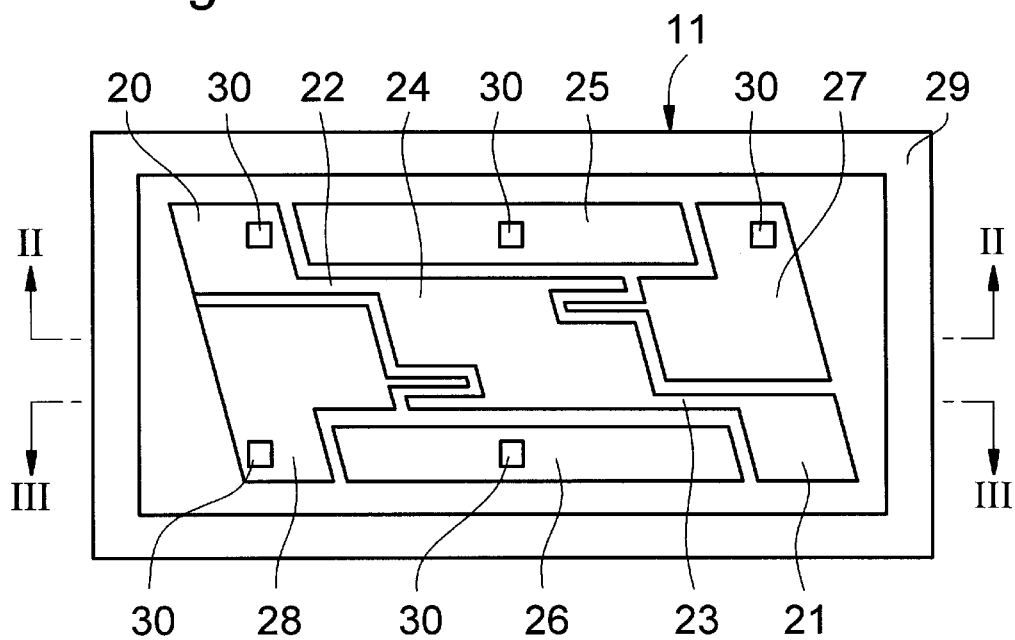
FIG. 4 is a plan view of the sensor chip 2 with the protective substrate 12 removed, and shows the structure of the sensor unit 11.
Figure 5:
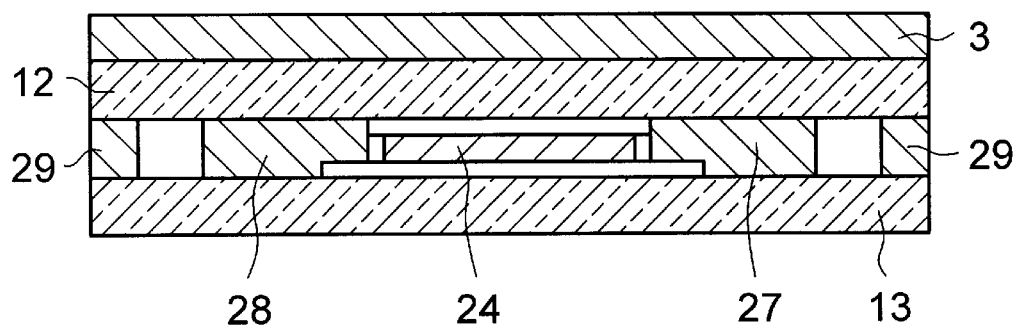
FIG. 5 is a cross sectional view of sensor chip 2 and IC chip 3 along line II—II in FIG. 4.
Figure 6:
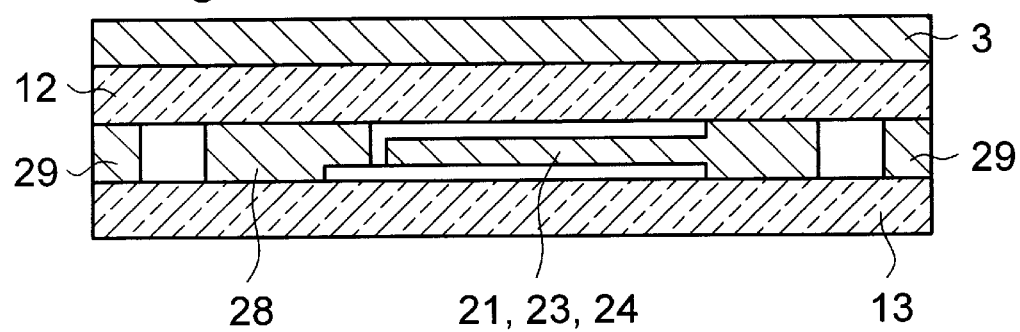
FIG. 6 is a cross sectional view of sensor chip 2 and IC chip 3 along line III—III in FIG. 4.

The internal structure of sensor chip 2 shown in FIG. 2 is shown in FIG. 3 to FIG. 6. FIG. 3 is a cross sectional view through line I—I in FIG. 2. FIG. 4 is a plan view of the sensor chip 2 with the protective substrate 12 removed, and shows the structure of the sensor unit 11. FIG. 5 is a cross sectional view of sensor chip 2 and IC chip 3 through line II—II in FIG. 4. FIG. 6 is a cross sectional view of sensor chip 2 and IC chip 3 through line III—III in FIG. 4.

As shown in FIG. 3 to FIG. 6, the sensor unit 11 comprises anchors 20 and 21 made from a silicon substrate; beams 22 and 23; a mass 24; fixed electrodes 25 and 26; fixed testing electrodes 27 and 28 formed for testing and inspection purposes; and support frame 29. Plural connection electrodes 30 are formed from Cr, Au, or other conductor on the side of the protective substrate 12 to which the anchor 20, fixed electrodes 25 and 26, and fixed testing electrodes 27 and 28 are formed.

The anchors 20 and 21, beams 22 and 23, and mass 24 are integrally formed to constitute a vibrating body, and thus effectively constitute mass 24 as a moving electrode. Note that the displacement of the mass 24 is in the Y direction referenced to the X-Y-Z coordinate system shown in FIG. 2.

A sensor chip 2 thus comprised can be manufactured by etching channels into a silicon device wafer, anodically bonding the silicon device wafer to the protective substrate 13, and then anistropically etching the wafer to form the anchors 20 and 21, beams 22 and 23, mass 24, fixed electrodes 25 and 26, fixed testing electrodes 27 and 28, and support frame 29. After then forming the connection electrodes 30 at the appropriate positions, protective substrate 12 is anodically bonded to the sensor unit 11 over anchors 20 and 21, fixed electrodes 25 and 26, fixed testing electrodes 27 and 28, and support frame 29.

A particular gap is formed between the protective substrates 12 and 13 and beams 22 and 23 and mass 24 by substrate etching. The mass 24 can therefore be displaced in the direction of fixed electrodes 25 and 26 by beams 22 and 23 pivoting on anchors 20 and 21, and anchors 20 and 21, fixed electrodes 25 and 26, fixed testing electrodes 27 and 28, and support frame 29 are anodically bonded to protective substrates 12 and 13. Note that one electrode is formed by anchors 20 and 21, beams 22 and 23, and mass 24, and mass 24 thus functions as a moving electrode. This moving electrode is insulated from fixed electrode 25, fixed electrode 26, fixed testing electrode 27, fixed testing electrode 28, and support frame 29 by means of the spaces disposed respectively therebetween.

The IC chip 3 is then bonded to a particular position on protective substrate 12 using resin, solder, silver paste, or other adhesive agent. It should be noted that if IC chip 3 is bonded to protective substrate 12 using a silicon resin or other low stress resin, the effects of variations in electrical characteristics resulting from differences in the thermal expansion coefficients of the protective substrate 12 and IC chip 3 at low and high temperatures can be alleviated.

Electrode holes 15 are also preformed in protective substrate 12 at positions corresponding to the connection electrodes 30. The protective substrate 12 is bonded to the sensor unit 11 so that the connection electrodes 30 are not blocked, and IC chip 3 is connected to the connection electrodes 30 by means of lead wires 7 passing through the electrode holes 15.

With the capacitance-type semiconductor acceleration sensor 1 thus comprised, when the force of inertia acts on the sensor chip 2 as a result of acceleration, the mass 24 is displaced in the direction of fixed electrode 25 or fixed electrode 26 by means of beams 22 and 23 pivoting on anchors 20 and 21. This produces a change in the electrostatic capacity of the capacitor formed between the fixed electrode 25 and mass 24, and a change in the electrostatic capacity of the capacitor formed between the fixed electrode 26 and mass 24. The IC chip 3 then detects the acceleration based on the electrostatic capacity values detected through the lead wires 7 from the connection electrodes 30 connected to anchor 20 and the fixed electrodes 25 and 26.

Note that the fixed testing electrodes 27 and 28 are electrodes for testing the sensor chip 2. When the force of inertia is not applied to the sensor chip 2 and a voltage is applied to the fixed testing electrodes 27 and 28 from the IC chip 3 via the lead wires 7, a potential difference is generated between the fixed testing electrodes 27 and 28 and the mass 24, and mass 24 is thus displaced by the force of electrostatic attraction. This force of electrostatic attraction is apparently equal to such external forces as the force of inertia acting on the sensor chip 2. The IC chip 3 is therefore able to detect the change at this time in the electrostatic capacity of the capacitor formed between the one fixed electrode 25 and the mass 24, and the electrostatic capacity of the capacitor formed between the other fixed electrode 26 and mass 24, and thereby determine whether the mass 24 of the sensor chip 2 is displacing reliably. The fixed testing electrodes 27 and 28 can thus be used to achieve a self-diagnostic testing function.

The protective substrate 13 of the sensor chip 2 thus comprised is bonded to the die pad 4 by a die bonding process, and the IC chip 3 and particular lead terminals 6, and the die pad 4 and particular lead terminals 6, are electrically connected by means of lead wires 7. A package 8 is then formed by molding the sensor chip 2, IC chip 3, lead wires 7, and connections between the lead wires 7 and lead terminals 6 with a resin. The lead terminals 6 are then bent so that when the resulting capacitance-type semiconductor acceleration sensor 1 is mounted to the circuit board the die pad 4 is appropriately positioned facing the mounting surface of the capacitance-type semiconductor acceleration sensor 1. The lead terminal 6 connected to the die pad 4 by a lead wire 7 is then connected to the ground wiring pattern formed in the circuit board 5 when the capacitance-type semiconductor acceleration sensor 1 is mounted to the circuit board 5, thereby grounding the die pad 4.

Referring again to FIG. 1, a ground pattern 35 providing the grounding wire for the capacitance-type semiconductor acceleration sensor 1 is formed in the circuit board 5 at the position to which the capacitance-type semiconductor acceleration sensor 1 is mounted, and the capacitance-type semiconductor acceleration sensor 1 is specifically mounted to the circuit board 5 over this ground pattern 35. The ground pattern 35 is also preferably formed in the surface of the circuit board 5 to which the package 8 of capacitance-type semiconductor acceleration sensor 1 is mounted in a pattern equal to or larger than the size of the package 8.

It is further advantageous to connect a capacitor with good frequency characteristics, e.g., an approximately 100 pF ceramic capacitor, as a bypass capacitor between lead terminals 6 and the ground, and particularly between the lead terminal 6 used as an output terminal and the ground, and the lead terminal 6 used as a power supply terminal and the ground, in the capacitance-type semiconductor acceleration sensor 1 described above.

The capacitance-type semiconductor acceleration sensor 1 of the first embodiment described above thus forms sensor chip 2 and IC chip 3 disposed between the die pad 4 and circuit board 5 and grounds the die pad 4. The die pad 4 thus shields the sensor chip 2 from electromagnetic wave noise and other external noise factors, and the capacitance-type semiconductor acceleration sensor 1 can thus be made resistant to such external noise factors as electromagnetic waves.

Moreover, by forming a ground pattern 35 on circuit board 5 at the position to which the capacitance-type semiconductor acceleration sensor 1 is mounted, sensor chip 2 and IC chip 3 are disposed between two ground planes, specifically the die pad 4 and the ground pattern 35. Shielding from such external noise factors as electromagnetic waves is thereby further enhanced, and the capacitance-type semiconductor acceleration sensor 1 is made even more resistant to the effects of external noise factors.

Furthermore, by connecting a capacitor with good frequency characteristics between lead terminals 6 and the ground as a bypass capacitor, shielding from such external noise factors as electromagnetic waves is yet further enhanced, thereby making the capacitance-type semiconductor acceleration sensor 1 even more resistant to the effects of such external noise factors as electromagnetic waves.

Embodiment 2

The second embodiment of a capacitance-type semiconductor acceleration sensor 1 according to the invention additionally grounds the support frame 29 to further shield the sensor chip 2 from noise conducted horizontally.

Figure 7:
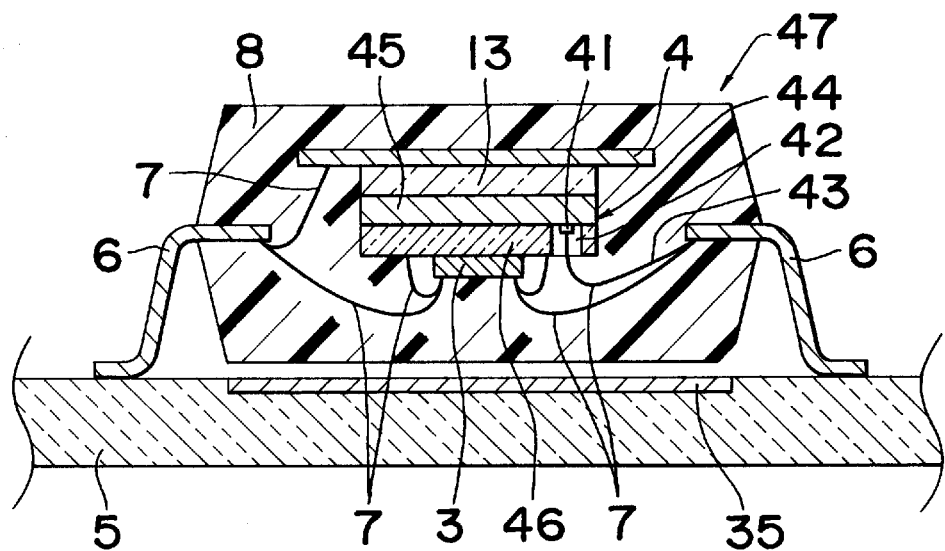
FIG. 7 is a cross sectional diagram of a capacitance-type semiconductor acceleration sensor according to the second embodiment of the invention.
Figure 8:
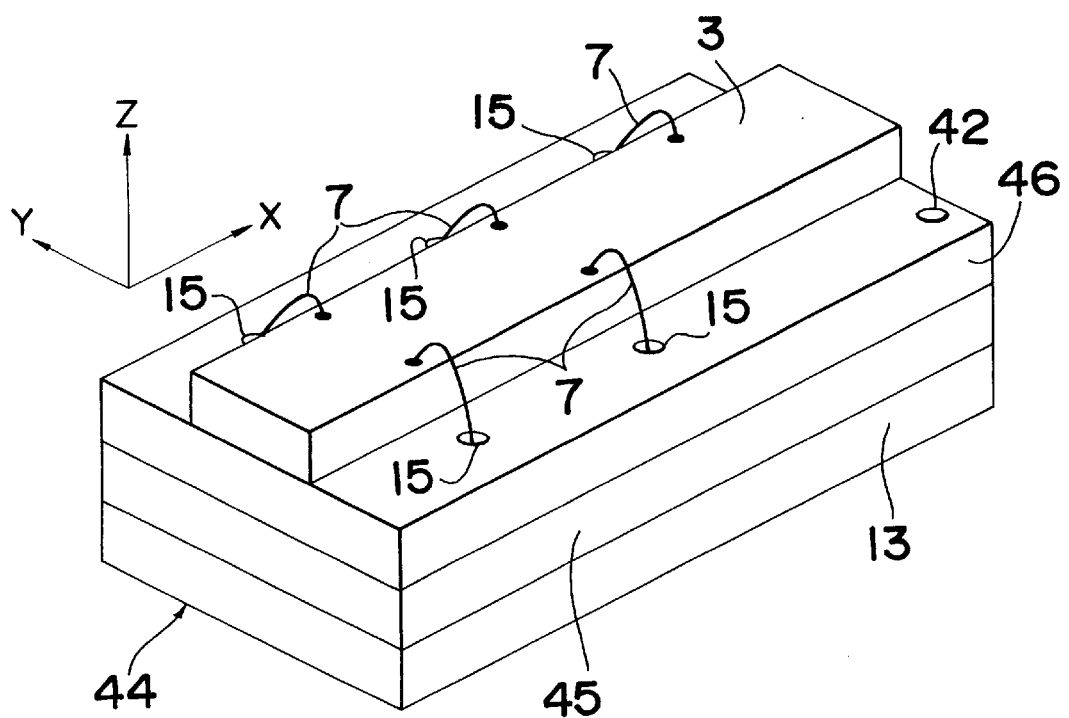
FIG. 8 is an overview of the sensor chip 44 and IC chip 3 shown in FIG. 7.
Figure 9:
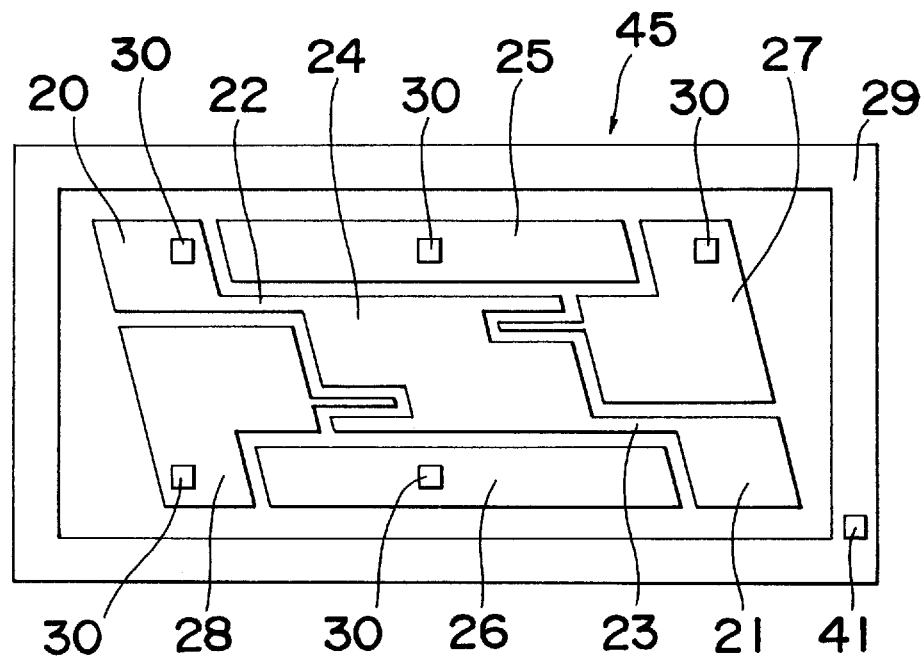
FIG. 9 is a plan view of the sensor unit 45 shown in FIG. 7 and FIG. 8.

FIG. 7 is a cross sectional diagram of a capacitance-type semiconductor acceleration sensor 47 according to the second embodiment of the invention. FIG. 8 is an overview of the sensor chip 44 and IC chip 3 shown in FIG. 7. FIG. 9 is a plan view of the sensor unit shown in FIG. 7 and FIG. 8. Note that like parts are indicated by the same reference numbers in FIG. 7 to FIG. 9 and FIG. 1 to FIG. 6. Further description thereof is thus omitted below, and only the differences between the embodiments are described.

The embodiment shown in FIG. 7 to FIG. 9 differs from that in FIG. 1 to FIG. 6 in that a connection electrode 41 of Cr, Au, or other conductor is formed on the surface of the protective substrate 12 to which the sensor unit support frame 29 is disposed, an electrode hole 42 is formed in the protective substrate 12 at a position corresponding to the connection electrode 41, and the connection electrode 41 is connected to a lead terminal 6 by a lead wire 43. Therefore, the sensor chip 2 shown in FIG. 1 to FIG. 6 is referenced in FIG. 7 to FIG. 9 as sensor chip 44, the sensor unit 11 as sensor unit 45, the protective substrate 12 as protective substrate 46, and the capacitance-type semiconductor acceleration sensor 1 as capacitance-type semiconductor acceleration sensor 47. Note that the support frame 29 is the external frame.

Referring to FIG. 7 to FIG. 9, this capacitance-type semiconductor acceleration sensor 47 comprises a sensor chip 44 for sensing acceleration and converting acceleration to a change in electrostatic capacity; an IC chip 3 for converting the change in electrostatic capacity output by the sensor chip 44 to an electrical signal, and applying a particular signal processing operation to the resulting electrical signal; a die pad 4 to which the sensor chip 44 is die bonded; lead terminals 6 for electrical connection to the circuit board 5; bonding wires or other lead wires 7 and 43 for connecting the sensor chip 44 and IC chip 3, the IC chip 3 and lead terminals 6, and the die pad 4 and lead terminals 6; and a molded resin package 8.

The sensor chip 44 comprises a sensor unit 45 and a pair of protective substrates 13 and 46 disposed on opposing sides of the sensor unit 45. The sensor unit 45 is made from a silicon substrate and converts the inertial force of acceleration to a change in electrostatic capacity. The protective substrates 13 and 46 are made from a material such as aluminosilicate or borosilicate glass having a linear expansion coefficient close to that of silicon. The IC chip 3 converts the change in electrostatic capacity output from the sensor unit 45 to an electrical signal, and applies particular signal processing to the electrical signal.

Plural electrode holes 15, i.e., through-holes, for connecting particular electrodes on sensor unit 45 to IC chip 3 by means of lead wires 7, and an electrode hole 42 for connecting connection electrode 41 to a lead terminal 6 by a lead wire 43, are formed in protective substrate 46. The IC chip 3 is bonded to protective substrate 46 with an adhesive or other bonding means.

As shown in FIG. 9, the sensor unit 45 comprises anchors 20 and 21 made from a silicon substrate; beams 22 and 23; a mass 24; fixed electrodes 25 and 26; fixed testing electrodes 27 and 28 formed for testing and inspection purposes; and support frame 29. Plural connection electrodes 30 are formed from Cr, Au, or other conductor on the side of the protective substrate 46 to which the anchor 20, fixed electrodes 25 and 26, and fixed testing electrodes 27 and 28 are formed. A connection electrode 41 is also formed from Cr, Au, or other conductor on the side of the protective substrate 46 to which the support frame 29 is disposed.

A sensor chip 44 thus comprised can be manufactured by etching channels into a silicon device wafer, anodically bonding the silicon device wafer to the protective substrate 13, and then anistropically etching the wafer to form the anchors 20 and 21, beams 22 and 23, mass 24, fixed electrodes 25 and 26, fixed testing electrodes 27 and 28, and support frame 29. After then forming the connection electrodes 30 and 41 at the appropriate positions, protective substrate 46 is anodically bonded to the sensor unit 11 over anchors 20 and 21, fixed electrodes 25 and 26, fixed testing electrodes 27 and 28, and support frame 29.

A particular gap is formed between the protective substrates 46 and 13 and beams 22 and 23 and mass 24 by substrate etching. The mass 24 can therefore be displaced in the direction of fixed electrodes 25 and 26 by beams 22 and 23 pivoting on anchors 20 and 21, and anchors 20 and 21, fixed electrodes 25 and 26, fixed testing electrodes 27 and 28, and support frame 29 are anodically bonded to protective substrates 46 and 13.

The IC chip 3 is then bonded to a particular position on protective substrate 46 using resin, solder, silver paste, or other adhesive agent. Electrode holes 15 are also preformed in protective substrate 46 at positions corresponding to the connection electrodes 30, and an electrode hole 42 is formed a the position corresponding to the connection electrode 41. The protective substrate 46 is bonded to the sensor unit 11 so that the protective substrate 46 is not bonded over the connection electrodes 30 and 41. IC chip 3 is then connected to the connection electrodes 30 by means of lead wires 7 passing through the electrode holes 15, and a particular lead terminal 6 is connected to the other connection electrode 41 by a lead wire 43. The lead terminal 6 to which the connection electrode 41 is connected by the lead wire 43 is grounded by connected to the ground pattern formed in the circuit board 5.

By thus grounding the connection electrode 41 disposed to the support frame 29, the free capacity is stabilized, and the support frame 29 can be used as an electrostatic shield.

As in the first embodiment described above, a ground pattern 35 providing the grounding wire for the capacitance-type semiconductor acceleration sensor 47 is formed in the circuit board 5 at the position to which the capacitance-type semiconductor acceleration sensor 47 is mounted, and the capacitance-type semiconductor acceleration sensor 47 is specifically mounted to the circuit board 5 over this ground pattern 35. The ground pattern 35 is also preferably formed in the surface of the circuit board 5 to which the package 8 of capacitance-type semiconductor acceleration sensor 47 is mounted in a pattern equal to or larger than the size of the package 8.

It is further advantageous to connect a capacitor with good frequency characteristics, e.g., an approximately 100 pF ceramic capacitor, as a bypass capacitor between lead terminals 6 and the ground, and particularly between the lead terminal 6 used as an output terminal and the ground, and the lead terminal 6 used as a power supply terminal and the ground, in the capacitance-type semiconductor acceleration sensor 47 described above.

The capacitance-type semiconductor acceleration sensor 47 of the second embodiment described above thus forms sensor chip 44 and IC chip 3 disposed between the die pad 4 and circuit board 5, and grounds the die pad 4 and the sensor unit support frame 29 of the sensor chip 44. The die pad 4 and support frame 29 thus shield the sensor chip 44 from electromagnetic wave noise and other external noise factors, and the capacitance-type semiconductor acceleration sensor 47 can thus be made resistant to such external noise factors as electromagnetic waves.

Moreover, by forming a ground pattern 35 on circuit board 5 at the position to which the capacitance-type semiconductor acceleration sensor 47 is mounted, sensor chip 44 and IC chip 3 are disposed between two ground planes, specifically the die pad 4 and the ground pattern 35. When combined with grounding the sensor unit support frame 29, shielding from such external noise factors as electromagnetic waves is further enhanced, and the capacitance-type semiconductor acceleration sensor 47 is yet further resistant to the effects of such external noise factors.

Furthermore, by connecting a capacitor with good frequency characteristics between lead terminals 6 and the ground as a bypass capacitor, shielding from such external noise factors as electromagnetic waves is yet further enhanced, thereby making the capacitance-type semiconductor acceleration sensor 47 even more resistant to the effects of such external noise factors as electromagnetic waves.

Embodiment 3

The third embodiment of a capacitance-type semiconductor acceleration sensor 54 according to the invention shields the sensor chip 2 from noise conducted from all directions by using a different grounding method. Specifically, rather than grounding the die pad 4 to shield the sensor chip 2, all external surfaces of the sensor chip 2 are coated with a conductive metal vapor deposition coating, and this conductive metal coating is then grounded, thereby shielding the sensor chip 2 from noise from all directions.

Figure 10:
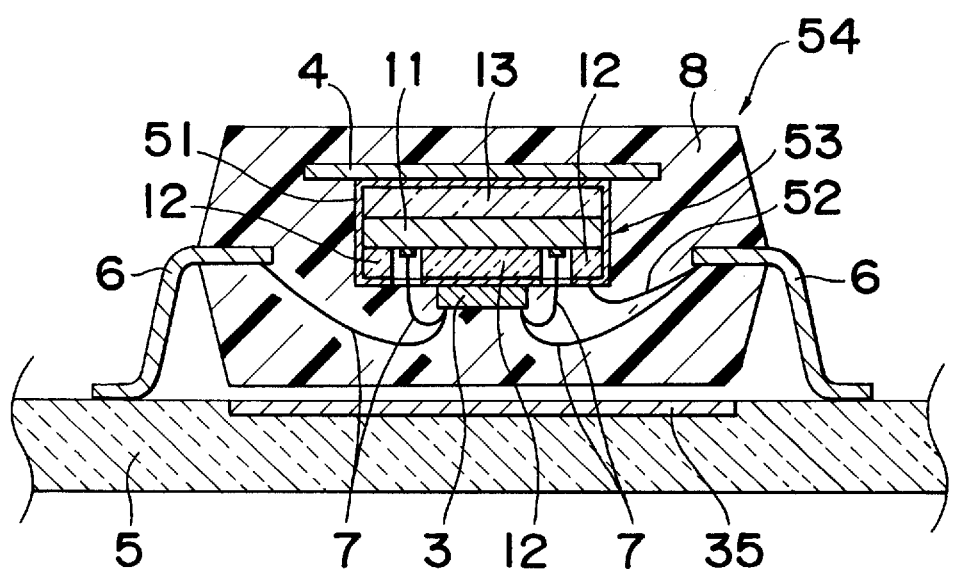
FIG. 10 is a cross sectional diagram of a capacitance-type semiconductor acceleration sensor according to the third embodiment of the invention.
Figure 11:
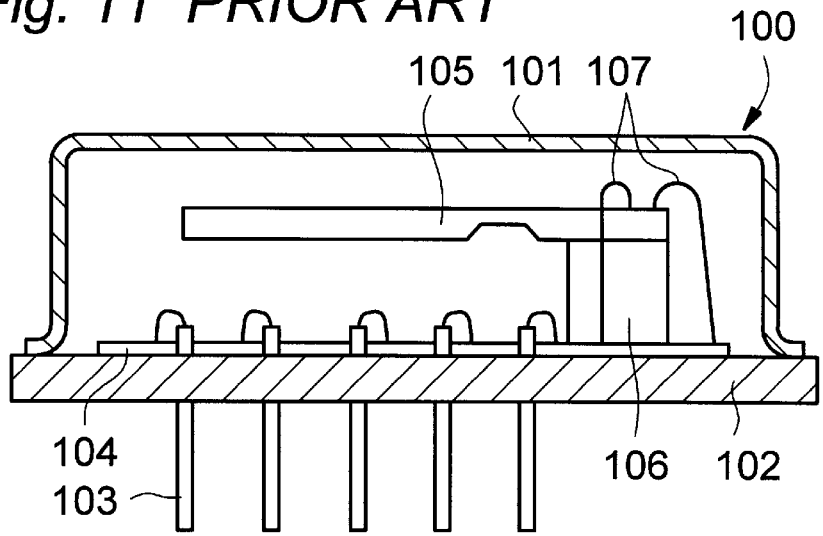
FIG. 11 is a cross section of a conventional semiconductor acceleration sensor using a hermetically sealed package.
Figure 12:
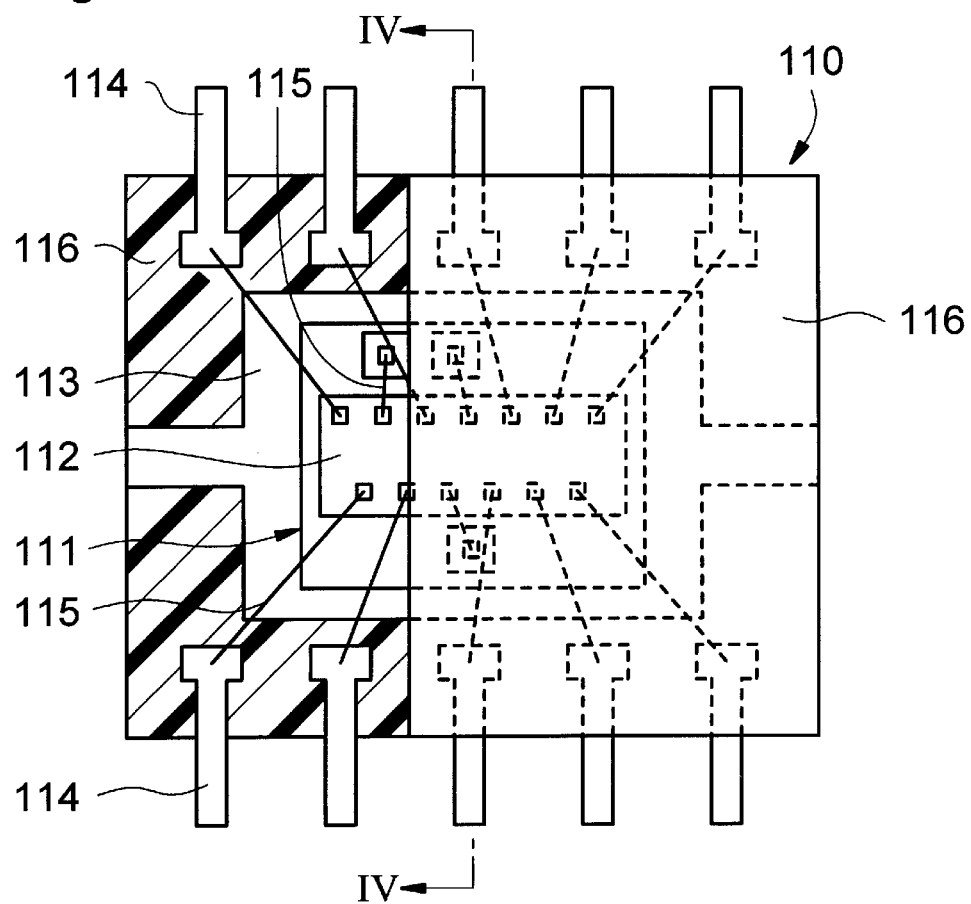
FIG. 12 is a partial cross section of a conventional capacitance-type semiconductor acceleration sensor.
Figure 13:
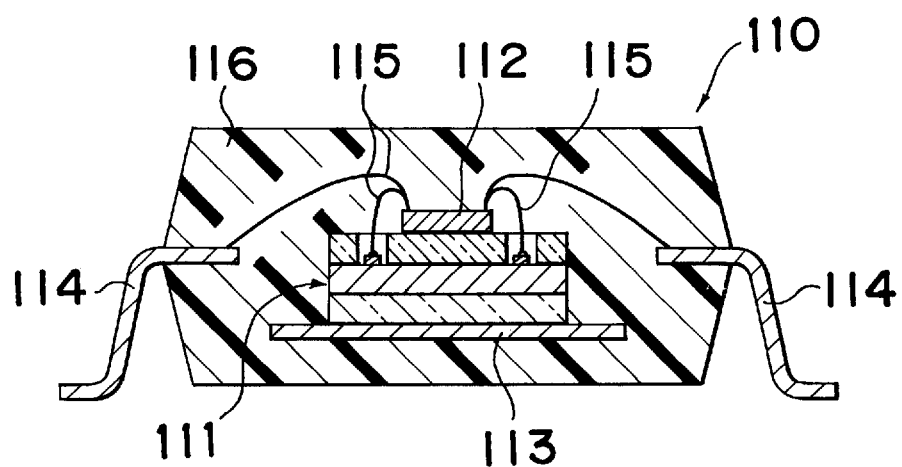
FIG. 13 is a cross section along line IV—IV in FIG. 12.

FIG. 10 is a cross sectional diagram of a capacitance-type semiconductor acceleration sensor 54 according to the third embodiment of the invention. Note that like parts are indicated by the same reference numbers in FIG. 10 and FIG. 1. Further description thereof is thus omitted below, and only the differences between the embodiments are described.

The embodiment shown in FIG. 10 differs from that in FIG. 1 in that the die pad 4 is not connected to a particular lead terminal 6 by a lead wire 7, and a gold or other conductive metal 51 is vapor deposited to all surfaces of the sensor chip 2. This vapor-deposited conductive metal 51 is then connected to a particular lead terminal 6 by a lead wire 52. Therefore, the sensor chip 2 shown in FIG. 1 is referenced in FIG. 10 as sensor chip 53, and the capacitance-type semiconductor acceleration sensor 1 as capacitance-type semiconductor acceleration sensor 54.

Referring to FIG. 10, this capacitance-type semiconductor acceleration sensor 54 comprises a sensor chip 53 for sensing acceleration and converting acceleration to a change in electrostatic capacity; an IC chip 3 for converting the change in electrostatic capacity output by the sensor chip 53 to an electrical signal, and applying a particular signal processing operation to the resulting electrical signal; a die pad 4 to which the sensor chip 53 is die bonded; lead terminals 6 for electrical connection to the circuit board 5; bonding wires or other lead wires 7 for connecting the sensor chip 53 and IC chip 3, and the IC chip 3 and lead terminals 6; a bonding wire or other lead wire 52 for connecting the conductive metal 51 coating of the sensor chip 53 to a particular lead terminal 6; and a molded resin package 8.

The sensor chip 53 comprises a sensor unit 11, a pair of protective substrates 12 and 13 disposed on opposing sides of the sensor unit 11, and a conductive metal 51 coating form by metal vapor deposition. The sensor unit 11 is made from a silicon substrate and converts the inertial force of acceleration to a change in electrostatic capacity. The protective substrates 12 and 13 are made from a material such as aluminosilicate or borosilicate glass having a linear expansion coefficient close to that of silicon.

Plural electrode holes 15, i.e., through-holes, for connecting particular electrodes on sensor unit 11 to IC chip 3 by means of lead wires 7. The protective substrates 12 and 13 are then anodically bonded on opposite sides of sensor unit 11 with the sensor unit 11 disposed therebetween, and the entire outside of the bonded substrates and sensor unit 11, except for the electrode holes 15, is then coated with a conductive metal 51 using a vapor deposition process to form the sensor chip 53. In other words, the sensor chip 53 of this embodiment is achieved by imparting by vapor deposition a conductive metal 51 coating on all exterior surfaces except the electrode holes 15 of the sensor chip 2 according to the first embodiment described above.

The IC chip 3 is then bonded to a particular position on the conductive metal 51 coating formed on the protective substrate 12 using resin, solder, silver paste, or other adhesive agent. Electrode holes 15 are also preformed in protective substrate 12 at positions corresponding to the connection electrodes 30. The protective substrate 12 is bonded to the sensor unit 11 so that the protective substrate 12 is not bonded over the connection electrodes 30, and the conductive metal 51 coating is formed so that it does not coat the connection electrodes 30. IC chip 3 is then connected to the connection electrodes 30 by means of lead wires 7 passing through the electrode holes 15.

The protective substrate 13 of the sensor chip 53 thus comprised is bonded to the die pad 4 by die bonding to the conductive metal 51. The IC chip 3 and particular lead terminals 6, and the conductive metal 51 and a particular lead terminal 6, are then electrically connected by means of lead wires 7. A package 8 is then formed by molding the sensor chip 53, IC chip 3, lead wires 7 and 52, and connections between the lead wires 7 and 52 and lead terminals 6 with a resin. The lead terminals 6 are then bent so that when the resulting capacitance-type semiconductor acceleration sensor 54 is mounted to the circuit board the die pad 4 is appropriately positioned facing the mounting surface of the capacitance-type semiconductor acceleration sensor 54.

The lead terminal 6 connected to the conductive metal 51 by a lead wire 52 is then connected to the ground wiring pattern formed in the circuit board 5 when the capacitance-type semiconductor acceleration sensor 54 is mounted to the circuit board 5, thereby grounding the conductive metal 51.

As in the first embodiment above, a ground pattern 35 providing the grounding wire for the capacitance-type semiconductor acceleration sensor 54 is formed in the circuit board 5 at the position to which the capacitance-type semiconductor acceleration sensor 54 is mounted, and the capacitance-type semiconductor acceleration sensor 54 is specifically mounted to the circuit board 5 over this ground pattern 35. The ground pattern 35 is also preferably formed in the surface of the circuit board 5 to which the package 8 of capacitance-type semiconductor acceleration sensor 54 is mounted in a pattern equal to or larger than the size of the package 8.

It is further advantageous to connect a capacitor with good frequency characteristics, e.g., an approximately 100 pF ceramic capacitor, as a bypass capacitor between lead terminals 6 and the ground, and particularly between the lead terminal 6 used as an output terminal and the ground, and the lead terminal 6 used as a power supply terminal and the ground, in the capacitance-type semiconductor acceleration sensor 54 described above.

The capacitance-type semiconductor acceleration sensor 54 of the third embodiment described above thus forms sensor chip 53 by vapor depositing a conductive metal 51 on all external surfaces other than the electrode holes 15 of the sensor chip 2 according to the first embodiment.

By then grounding this conductive metal 51, the capacitance-type semiconductor acceleration sensor 54 is shielded in all directions from electromagnetic waves and other external noise, and the capacitance-type semiconductor acceleration sensor 54 can thus be made resistant to such external noise factors as electromagnetic waves.

Moreover, by forming a ground pattern 35 on circuit board 5 at the position to which the capacitance-type semiconductor acceleration sensor 54 is mounted, IC chip 3 is disposed between two ground planes, specifically the grounded conductive metal 51 and the ground pattern 35. As a result, the capacitance-type semiconductor acceleration sensor 54 is better shielded from such external noise factors as electromagnetic waves, and the capacitance-type semiconductor acceleration sensor 54 is made yet further resistant to the effects of such external noise factors.

Furthermore, by connecting a capacitor with good frequency characteristics between lead terminals 6 and the ground as a bypass capacitor, shielding from such external noise factors as electromagnetic waves is yet further enhanced, thereby making the capacitance-type semiconductor acceleration sensor 54 even more resistant to the effects of such external noise factors as electromagnetic waves.

The semiconductor acceleration sensor according to a preferred embodiment of the invention bonds the IC chip to a sensor chip, then bonds the sensor chip to a die pad, and disposes said die pad in a direction facing the mounting surface when the semiconductor acceleration sensor is mounted to a circuit board with the IC chip and sensor chip between the die pad and mounting surface. The die pad is then grounded. As a result, the semiconductor acceleration sensor is shielded by the die pad from electromagnetic waves and other external noise, and even semiconductor acceleration sensors in resin molded packages can be made resistant to such external noise factors as electromagnetic waves. Operating errors caused by the effects of such external noise factors as electromagnetic waves can therefore be reduced, and both the size and cost of the semiconductor acceleration sensor can be reduced.

When the semiconductor acceleration sensor of the invention is achieved as a capacitance-type semiconductor acceleration sensor in which a sensor chip detects and converts acceleration to a change in electrostatic capacity, and an IC chip converts the change in electrostatic capacity output by the sensor chip to an electrical signal, and applies a particular signal processing operation to the resulting electrical signal, the IC chip is bonded to a sensor chip, the sensor chip is then bonded to a die pad, said die pad is disposed in a direction facing the mounting surface when the semiconductor acceleration sensor is mounted to a circuit board with the IC chip and sensor chip between the die pad and mounting surface, and the die pad is grounded. As a result, the capacitance-type semiconductor acceleration sensor is shielded by the die pad from electromagnetic waves and other external noise, and even capacitance-type semiconductor acceleration sensors in resin molded packages can be made resistant to such external noise factors as electromagnetic waves. Operating errors caused by the effects of such external noise factors as electromagnetic waves can therefore be reduced, and both the size and cost of the semiconductor acceleration sensor can be reduced.

When the external frame of the sensor unit is further grounded, the semiconductor acceleration sensor of the invention an be further shielded by the die pad and external frame from electromagnetic waves and other external noise, and even capacitance-type semiconductor acceleration sensors in resin molded packages can be made resistant to such external noise factors as electromagnetic waves. Operating errors caused by the effects of such external noise factors as electromagnetic waves can therefore be further reduced, and both the size and cost of the semiconductor acceleration sensor can be reduced.

In a further embodiment of a semiconductor acceleration sensor according to the invention the sensor chip is coated substantially completely with a conductive metal vapor deposition coating, and said conductive metal is grounded. The semiconductor acceleration sensor can thus be shielded from such external noise factors as electromagnetic waves by the conductive metal coating, and even capacitance-type semiconductor acceleration sensors in resin molded packages can be made resistant to such external noise factors as electromagnetic waves. Operating errors caused by the effects of such external noise factors as electromagnetic waves can therefore be further reduced, and both the size and cost of the semiconductor acceleration sensor can be reduced.

When the semiconductor acceleration sensor of the invention is achieved as a capacitance-type semiconductor acceleration sensor in which a sensor chip detects and converts acceleration to a change in electrostatic capacity, and an IC chip converts the change in electrostatic capacity output by the sensor chip to an electrical signal, the sensor chip is coated substantially completely with a conductive metal vapor deposition coating, and said conductive metal is grounded. The semiconductor acceleration sensor can thus be shielded from such external noise factors as electromagnetic waves by the conductive metal coating, and even capacitance-type semiconductor acceleration sensors in resin molded packages can be made resistant to such external noise factors as electromagnetic waves. Operating errors caused by the effects of such external noise factors as electromagnetic waves can therefore be further reduced, and both the size and cost of the semiconductor acceleration sensor can be reduced.

When the semiconductor acceleration sensor of the invention is mounted with the sensor chip and IC chip thereof over the ground wiring pattern formed on the circuit board, the sensor chip and IC chip are disposed between two grounded planes. The semiconductor acceleration sensor is thus effectively shielded from such external noise factors as electromagnetic waves, and the semiconductor acceleration sensor can be made yet more effectively resistant to electromagnetic waves and other external noise factors. Operating errors caused by the effects of such external noise factors as electromagnetic waves can therefore be further reduced, and both the size and cost of the semiconductor acceleration sensor can be reduced.

Connecting a bypass capacitor to the lead terminals as also described above further enhances shielding against such external noise factors as electromagnetic waves. Operating errors caused by the effects of such external noise factors as electromagnetic waves can therefore be further reduced, and both the size and cost of the semiconductor acceleration sensor can be reduced.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor acceleration sensor comprising: a semiconductor sensor chip for detecting acceleration;
   an IC chip bonded to said sensor chip for processing a signal from said sensor chip;
   a die pad on which said semiconductor sensor chip is mounted; and
   a package with a plurality of lead terminals for resin molding said semiconductor sensor chip, IC chip and die pad together with lead wires for connecting them,
   wherein said die pad is electrically connected with a lead wire to ground said die pad through one of said lead terminals and said die pad is positioned remote from a mounting plate of said semiconductor sensor chip.

2. The semiconductor acceleration sensor according to claim 1, wherein said semiconductor sensor chip detects acceleration and converts to a change in electrostatic capacity, and said IC chip converts the change in electrostatic capacity output from said semiconductor sensor chip to an electrical signal and applies processing thereto.

3. The semiconductor acceleration sensor according to claim 2, wherein said semiconductor sensor chip is formed by bonding a pair of opposing protective substrates with a sensor unit disposed therebetween, said sensor unit is formed on a silicon substrate for detecting acceleration from the electrostatic capacity between a fixed electrode and a moving electrode that is displaced by the force of inertia at acceleration, and has an external frame that defines the contour of the sensor unit and is formed to be insulated from the moving electrode and fixed electrode while enclosing the moving electrode and fixed electrode, where said external frame is electrically connected to a particular lead terminal by a lead wire, and is grounded by said lead terminal.

4. The semiconductor acceleration sensor according to claim 1, wherein said semiconductor sensor chip is covered completely with a conductive metal vapor deposition coating and is grounded by electrically connecting said coating to one of said plural lead terminals with lead wire.

5. The semiconductor acceleration sensor according to claim 4, wherein said semiconductor sensor chip is formed by bonding a pair of opposing protective substrates with a sensor unit disposed therebetween, where the sensor unit is formed on a silicon substrate for detecting acceleration from the electrostatic capacity between a fixed electrode and a moving electrode that is displaced by the force of inertia from acceleration, and has an external frame that defines the contour of the sensor unit and is formed to be insulated from the moving electrode and fixed electrode while enclosing the moving electrode and fixed electrode.

6. The semiconductor acceleration sensor according to claim 1, wherein said semiconductor acceleration sensor is mounted on a circuit board so that said semiconductor sensor chip and said IC chip are positioned over the ground wiring pattern formed on the circuit board.

7. The semiconductor acceleration sensor according to claim 1, wherein said lead terminal which grounds said die pad is further connected to a bypass capacitor.

* * * * *